United States Patent
Goldrian et al.

(10) Patent No.: US 7,650,554 B2
(45) Date of Patent: Jan. 19, 2010

(54) METHOD AND AN INTEGRATED CIRCUIT FOR PERFORMING A TEST

(75) Inventors: Gottfried Goldrian, Boeblingen (DE); Otto Andreas Torreiter, Leinfelden-Echterdingen (DE); Dieter Wendel, Schoenaich (DE)

(73) Assignee: International Business Machines Corporation, Armonk, NY (US)

( * ) Notice: Subject to any disclaimer, the term of this patent is extended or adjusted under 35 U.S.C. 154(b) by 310 days.

(21) Appl. No.: 11/563,702

(22) Filed: Nov. 28, 2006

(65) Prior Publication Data

US 2007/0124637 A1 May 31, 2007

(30) Foreign Application Priority Data

Nov. 30, 2005 (EP) ................................. 05111481

(51) Int. Cl.
*G01R 31/28* (2006.01)
*G11C 29/00* (2006.01)

(52) U.S. Cl. ...................... 714/733; 714/731; 714/724; 714/735; 714/736; 365/200; 365/201

(58) Field of Classification Search ................. 714/733, 714/731, 724, 735, 736; 365/200, 201
See application file for complete search history.

(56) References Cited

U.S. PATENT DOCUMENTS 5,349,578 A * 9/1994 Tatsuki et al. ................ 370/244
5,381,087 A 1/1995 Hirano
6,134,674 A * 10/2000 Akasheh ...................... 714/33
2004/0044491 A1 3/2004 Yonaga et al.
2007/0140394 A1 * 6/2007 Schulz et al. ............... 375/355

FOREIGN PATENT DOCUMENTS

EP 0485238 5/1992
JP 200440037 A 2/2004

OTHER PUBLICATIONS

"Prototype Testing of High-Speed CMOS Digital Circuits", Circuits and System, 1996, ISCAS 1996, vol. 4, pp. 160-163.
"Method for Performing a Critical Path Test of a Fast Digital Circuit on Slow Test Equipment", IPCOMM0000185871D. Tommaso Bacigalupo.

* cited by examiner

*Primary Examiner*—Kevin L Ellis
*Assistant Examiner*—Daniel F McMahon
(74) *Attorney, Agent, or Firm*—Steven Chiu

(57) ABSTRACT

A method for performing a test of a high-speed integrated circuit with at least one functional unit and built-in self-test features by a low-speed test system. The method comprises the steps of transforming an external clock signal from the test system into a faster internal clock signal within the integrated circuit, generating a test pattern according to a predetermined scheme, and applying the test pattern to the functional unit, comparing a response from the functional unit with an expected test pattern. If the response differs from the expected test pattern, then an internal failure signal is generated and the internal failure signal is extended to a length, which may be recognized by the test system. Further the present invention relates to a high-speed integrated circuit with at least one functional unit and built-in self-test features.

14 Claims, 3 Drawing Sheets

METHOD AND AN INTEGRATED CIRCUIT FOR PERFORMING A TEST

BACKGROUND OF THE INVENTION

1. Field of the Invention

The present invention relates to a method for performing a test on an integrated circuit with built-in self-test features. Further the present invention relates to an integrated circuit with built-in self-test features.

2. Description of the Related Art

Integrated semiconductor circuits include a plurality of functional units. During the production said functional units have to be tested. For that purpose current integrated circuits have built-in self-test features, which are able to test the functional units in order to detect defects on the circuit. The results of said built-in self-test features have to be accessed by an external test system.

FIG. 3 shows a schematic diagram of an integrated circuit 70 with a functional unit 20 and said built-in self-test features according to the prior art. The integrated circuit 70 comprises an input terminal 12 and an output terminal 14. The input terminal 12 receives an external clock from the test system. The output terminal 14 sends a failure signal to the test system, if a defect is detected. Further the integrated circuit 70 comprises a clock distributor 16, a stimuli logic 18, the functional unit 20 and a comparator 22. The built-in self-test features are formed by the clock distributor 16, the stimuli logic 18 and the comparator 22.

The clock distributor 16 includes a PLL multiplier to transform the external clock from the test system into a faster internal clock within the integrated circuit. The stimuli logic 18 generates test patterns applied to the functional unit 20. The comparator 22 compares the response from the functional unit 20 with an expected test pattern. If a defect occurs within the functional unit 20 under test, then the response pattern does not match the expected value in the comparator 22 and the signal on the output terminal 14 will be set to a logic value indicating that a defect is detected. Said logic value on the output terminal 14 will be set back as soon as the built-in self-test features step further to the next test pattern. The counting of the pulses of the internal clock from the start of the pattern to the event of a failure signal allows the determination of stimuli and expected pattern at that time the failure occurs. In the case the functional unit is memory array, stimuli is the address to the array and the expected pattern is the data read from the memory array. On the basis of the failure addresses, a bit failure map can be built. These bit failure maps are required as an input for a physical analysis.

The test system is able to recognize every failure, if the integrated circuit and the test system work with a similar clock. However, if the internal clock within the integrated circuit is much faster than the clock of the test system, the integrated circuit cannot be tested at its maximum speed.

The article "Prototype testing of high-speed CMOS digital circuits" by Volker Schindler, ISCAS'96, Vol. 4, pp. 160-163, describes built-in self-test features, which may be switched between the proper integrated circuit under test and the test system. The test system is provided to determine the maximum frequency of the integrated circuit.

In the article "Method for performing a critical path test of a fast digital circuit on slow test equipment" by Tommaso Bacigalupo, IPCOM000018571D, a two-step-method is disclosed. Said two-step-method allows a high-speed test of an integrated circuit with a low-speed test system. In a first step the test runs at the full speed with an internal clock up to a point, where the timing violation is expected to occur. In a second step the test runs at a lower speed with an external clock.

U.S. Pat. No. 5,381,087 describes a high-speed LSI chip to be tested and evaluated by a low-speed semiconductor tester. A selector circuit switches between the oscillator of the high-speed LSI chip and the low-speed semiconductor tester in dependence of the frequency, which is required to activate high-speed LSI chip.

In EP 0 485 238 A2 an integrated circuit semiconductor chip for the detection of the required operational speed is disclosed. An oscillator circuit, a counter and a comparator are formed on the semiconductor chip. A tester provides timing, control and a display. If the speed of the operation is very high, then the speed is divided.

OBJECT OF THE INVENTION

It is an object of the present invention to provide an improved method and an integrated circuit for performing failure tests for function units within the integrated circuit, which allow a test run at the maximum speed of the integrated circuit.

SUMMARY OF THE INVENTION

The above object is achieved by a method as laid out in the independent claims. Further advantageous embodiments of the present invention are described in the dependent claims and are taught in the description below.

The core idea of one embodiment of the invention is to extend the internal failure signal to a multiple length of the internal clock. The internal failure signal is extended via a counter, which may be restarted. The resulting external failure signal satisfies the resolution of the test system, so that the test system is able to recognize the failure signal.

One embodiment of the invention has the advantage that the integrated circuit may be tested at its maximum speed and the test system with a slower clock is able to recognize the failure of the integrated circuit and the time, when the failure has occurred.

If several failures occur, the counter is triggered by a first failure signal and will be restarted by any further failure signal. The length of the resulting external signal depends substantially on the number the internal failure signals.

The preferred embodiment of the invention provides a time slot generator. If several failures occur, the test will be repeated with a time slot. The failure signal relates only to that failure within said time slot.

The above as well as additional objectives, features and advantages of the present invention will be apparent in the following detailed written description.

The novel and inventive features believed characteristics of the invention are set forth in the appended claims. The invention itself, preferred embodiments and advantages thereof will be best understood by reference to the following detailed description of preferred embodiments in conjunction with the accompanied drawings.

DETAILED DESCRIPTION OF THE DRAWINGS

Figure 1:
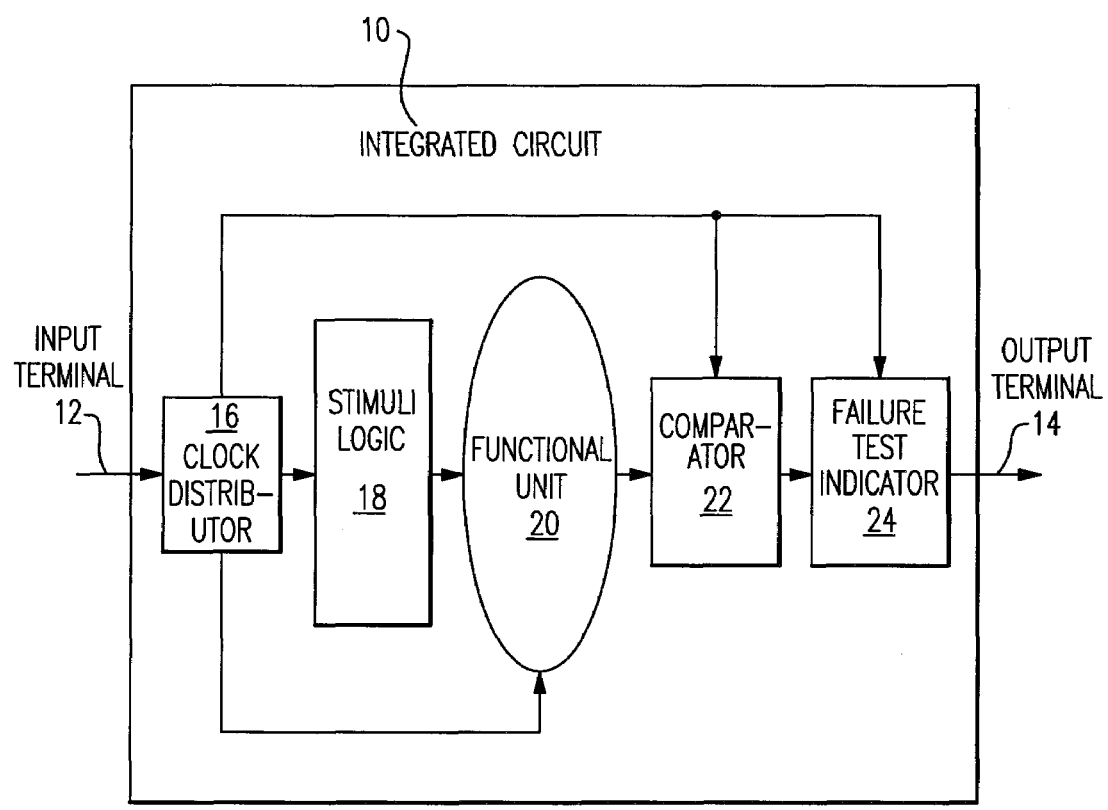
FIG. 1 shows a schematic diagram of a preferred embodiment of an integrated circuit with built-in self-test features according to an embodiment of the present invention.

FIG. 1 shows a schematic diagram of a preferred embodiment of an integrated circuit 10 with built-in self-test features according to an embodiment of the present invention. The integrated circuit 10 comprises an input terminal 12 and an output terminal 14. Further the integrated circuit 10 comprises a functional unit 20. In general the integrated circuit 10 comprises a plurality of functional units 20. In FIG. 1 only one functional unit 20 is shown. The functional unit 20 is the object under test. The integrated circuit 10 comprises a clock distributor 16, a stimuli logic 18, a comparator 22 and a failure test indicator 24, which form the self-test features.

The input terminal 12 is connected to the input of the clock distributor 16. The three outputs of the clock distributor 16 are connected to the functional unit 20 and the other self-test features, i.e. the stimuli logic 18, the comparator 22 and the failure test indicator 24. The output of the stimuli logic 18 is connected to the input of the functional unit 20. The output of the functional unit 20 is connected to the input of the comparator 22. The output of the comparator 22 is connected to the input of the failure test indicator 24. The output of the failure test indicator 24 is connected to the output terminal 14.

The clock distributor 16 includes a PLL multiplier, which is not shown in FIG. 1. The PLL multiplier transforms an external clock from the test system into a faster internal clock within the integrated circuit. The stimuli logic 18 generates test patterns applied to the functional unit 20. The comparator 22 compares the response from the functional unit 20 with an expected test pattern. If a defect occurs within the functional unit 20, then the response pattern does not match the expected test pattern in the comparator 22 and the internal failure signal on the output of the comparator 22 will be set to a logic value indicating that a defect is detected. In the failure test indicator 24 the internal failure signal is extended to a predetermined fixed number of internal clocks. The output terminal 14 provides an external failure signal, which may be completely recognized by the test system.

For example the frequency of the external clock of the test system is 500 MHz. The factor of the PLL multiplier may be n=8, resulting in an internal clock frequency of 4 GHz. There are eight internal clock cycles with 250 ps for every external clock cycle with 2 ns. The internal failure signal is expanded by n=8, resulting in a 2 ns pulse of the external failure signal.

For the calibration of the test system a burst of pulses at a known point in the pattern sequence may be generated. The pulses may start at different internal sub cycles of the external clock. The pulses may have different pulse widths in increments of the internal clock. The recognition of the pulse widths allows recognizing sequences of failures, which occur within a time difference, which is smaller than the pulse of the external failure signal on the output terminal 14. By counting the external clock cycles and strobing the position of the failure signal relative to the external clock signal, it is possible to get the absolute cycle number of the pattern as long as the strobe edge placement resolution of the test system is below the cycle of the internal clock.

In the example above with the internal clock cycle of 250 ps and a strobe edge placement resolution of 10 ps for the used test system, the resulting ratio would be 25 times. This is sufficient to recognize such an increased pulse width because of the sequences of failures. The pulse width contains the information of the number of failures, if a single failure occurs or if two failures in consecutive cycles occur. The single failure generates a pulse of 2 ns. In all other cases the number of the failures is not defined. For example, the first failure occurs in the first cycle and the second failure occurs in the third or a later cycle. A method to determine the number of the failures is described below.

Figure 2:
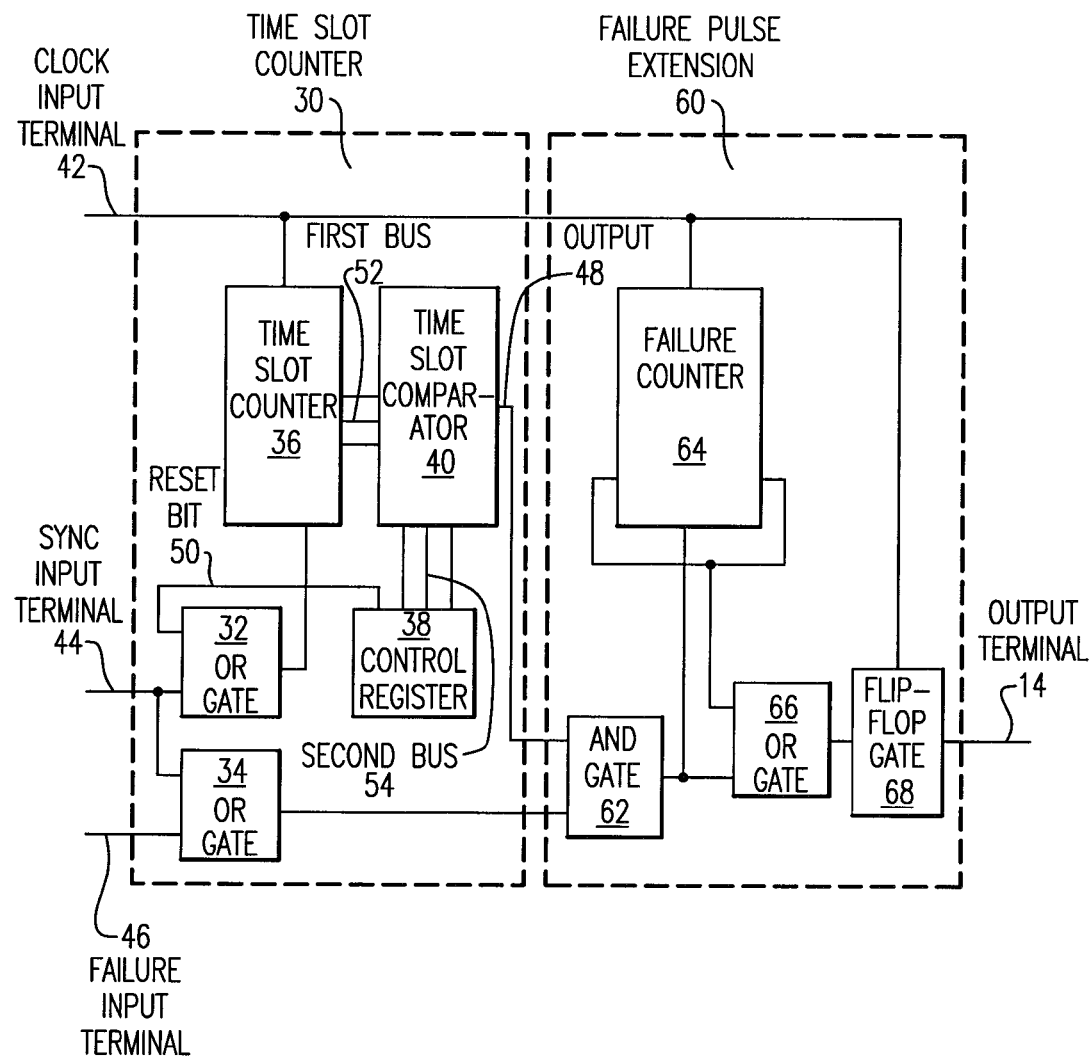
FIG. 2 shows a more detailed schematic diagram of a preferred embodiment of the built-in self-test features according to an embodiment of the present invention.

FIG. 2 shows a detailed representation of the failure test indicator 24. The failure test indicator 24 comprises a time slot generator 30 and a failure pulse extension 60.

The time slot generator 30 includes a first OR gate 32, a second OR gate 34, a time slot counter 36, a control register 38 and a time slot comparator 40. Further the time slot generator 30 includes a clock input terminal 42, a sync input terminal 44 and a failure input terminal 46. The clock input terminal 42 provides the internal clock. The sync input terminal 44 provides a sync pulse. The failure input terminal 46 provides the internal failure signal.

The time slot counter 36 and the time slot comparator 40 are connected via a first bus 52. The first bus 52 is a three-bit-bus. The control register 38 and the time slot comparator 40 are coupled via a second bus 54. The second bus 54 is also a three-bit-bus. The sync input terminal 44 is connected to an input of the first OR gate 32 and an input of the second OR gate 34. The clock input terminal is connected to the clock input of the time slot counter 36. The failure input terminal 46 is connected to another input of the second OR gate 34. A reset bit 50 of the control register 30 is connected to another input of the first OR gate 32. The output of the first OR gate 32 is connected with a reset input of the time slot counter 36. The time slot counter 36 is a three-bit counter and is therefore able to count up to the value n=8. The time slot comparator 40 compares the three bits of the first bus 52 with the three bits of the second bus 54. The time slot comparator 40 is able to compare each single bit of the buses 52 and 54.

The pulse extension 60 includes an AND gate 62, a failure counter 64, a third OR gate 66 and a flip-flop gate 68. An input of the AND gate 62 is connected to an output of the second OR gate 34. Another input of the AND gate 62 is connected to an output of the time slot comparator 40. An output of the AND gate 62 is connected to an reset input of the failure counter 64 and to an input of the third OR gate 66. Another input of the third OR gate 66 is connected to a carry output and to an enable input of the failure counter 64. An output of the third OR gate 66 is connected to an input of the flip-flop gate 68. An output of the flip-flop gate 68 is connected to the output terminal 14 and provides the external failure signal. The clock inputs of the failure counter 64 and the flip-flop gate 68 are connected to the clock input terminal 42.

The time slot generator 30 is synchronized with the sync pulse at each test start. The sync pulse is also visible at the output terminal 14. The sync pulse serves as a reference point, from which the clock cycles are counted to receive the address of the functional unit 20. The width of the pulse is n times of the internal clock. In the above example the pulse width is 2 ns, i.e. eight times of 250 ps, which is the same as the single pulse of the internal failure signal. However, the sync pulse starts always with the first time slot T0. Therefore the sync pulse is also the reference point for the position of the time slot. Since the internal clock is n times faster than the external clock, n time slots are generated. The test is repeated with one selected time slot to analyze undefined failure signals. In this case only those internal failure signals, which occur in the selected time slot, are visible at the output terminal 14.

In current tests a burst of functional cycles is limited to four cycles. Said cycles are separated be scan operation, which are much longer than the theoretical pulse width of the external failure signal. Taking this as an example for an application of the inventive method, the maximum width of the external failure signal is 2.75 ns. Assuming this result was received with the pulse extension, the time slot generator 30 is disabled in this first test via the control register 36. It is obvious that are at least two external failure signals with the extension to 2.75 ns. Now, the first and the last time slot are already known, but it is still not clear, what happened in the second time slot T1 and third time slot T2. The second time slot T1 and the third time slot T2 have to be selected in consecutive tests, in order to get the complete picture of the extended failure signal. For that purpose the time slot generator 30 is enabled and the respected time slots are selected via the control register 36.

In a first test the time slot generator 30 is bypassed by setting the reset bit 50 of the control register 36 to one and setting all the three bits of the second bus 54 to zero. The reset bit 50 at one holds the time slot counter 36 in the reset state and all the three bits of the first bus 52 at zero. Since the bit values at the first bus 52 and the second bus 54 are the same, then the output terminal 48 of the time slot comparator 40 is at one.

The output 48 of the time slot comparator 40 at one enables the failure signal to arrive at the reset pin of the failure counter 64. Further the output 48 of the time slot comparator 40 at one enables the data input of the output latch of the failure pulse extension 60. The failure counter 64, which is held at zero in the next clock cycle by the carry input of the failure counter 64, steps to zero in the next clock cycle. The failure counter 64 counts as long as it receives the carry pulse. Further the failure counter 64 restarts counting from zero, if another internal failure signal arrives. As long as the failure counter 64 does not receive the carry position, the carry signal is at one in all cases for seven cycles, if only one internal failure signal occurs. Since the failure pulse is at the latch before the counter starts, the failure signal includes eight cycles.

In the case of the example above, a second or third or forth failure signal may occur in the forth cycle relative to the first failure signal. Since each failure signal resets the failure counter 64 to zero the last failure signal in the forth cycle defines the length of the failure signal. The length of the failure signal is eleven cycles. In the next test the second time slot is selected by the control register 38. Assuming the sync pulse indicates that the failure pulse starts in the third time slot, then the second cycle is the forth time slot. The forth time slot T3 is selected via the control register 38 by setting the reset bit to zero and the three bit of the second bus 54 to one, zero and zero, respectively. Since the time slot counter 36 is synchronized by the synchronize pulse via the reset bit 50 the first bus 52 is reflecting the eight time slots.

This signal gates an existing failure pulse to the failure pulse extension 60 and an eight cycle long failure signal is generated. The same procedure has to be repeated with the selection of the fifth time slot T4 by setting the reset bit 50 of the control register 38 to zero and the three bits of the second bus 54 to one, zero and one, respectively.

Figure 3:
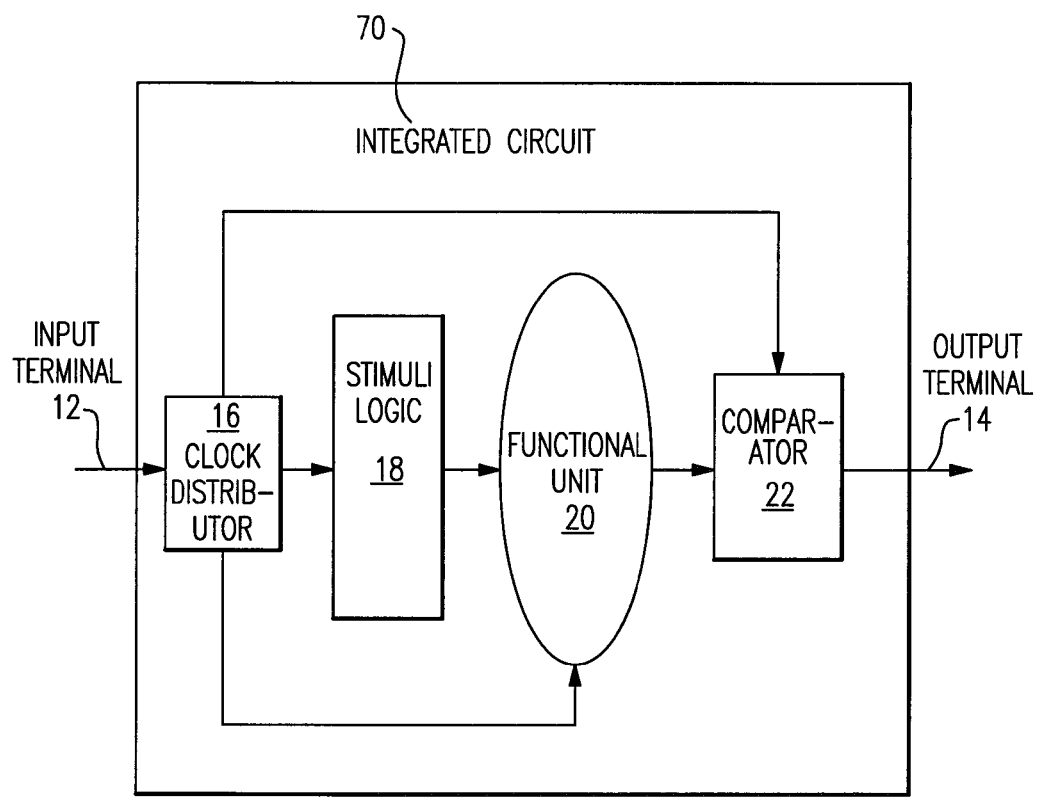
FIG. 3 shows a schematic diagram of an integrated circuit with built-in self-test features according to the prior art.

In FIG. 3 a schematic diagram of an integrated circuit 70 according to the prior art is shown. The integrated circuit 70 includes a functional unit 20 and the built-in self-test features. Like the integrated circuit 10 according to an embodiment of the invention the integrated circuit 70 of the prior art comprises the input terminal 12, the output terminal 14, the clock distributor 16, the stimuli logic 18, the functional unit 20 and the comparator 22.

The clock distributor 16, the stimuli logic 18, the functional unit 20 and the comparator 22 of the integrated circuit 70 work in the same way as the integrated circuit 10 according to an embodiment of the invention. The integrated circuit 70 of the prior art and the integrated circuit 70 of an embodiment of the invention differ in the failure test indicator 24. Therefore, if the clock within the integrated circuit 70 is much faster than the clock of the external test system, the integrated circuit 70 cannot be tested at its maximum speed. The test at the maximum speed is possible with of the integrated circuit 10 according to an embodiment of the invention.

The present invention can also be embedded in a computer program product, which comprises all the features enabling the implementation of the methods described herein. Further, when loaded in computer system, said computer program product is able to carry out these methods.

Although illustrative embodiments of the present invention have been described herein with reference to the accompanying drawings, it is to be understood that the present invention is not limited to those precise embodiments, and that various other changes and modifications may be affected therein by one skilled in the art without departing from the scope or spirit of the invention. All such changes and modifications are intended to be included within the scope of the invention as defined by the appended claims.

LIST OF REFERENCE NUMERALS 10 integrated circuit
12 input terminal
14 output terminal
16 distributor
18 stimuli logic
20 functional unit
22 comparator
24 failure test indicator
30 time slot generator
32 first OR gate
34 second OR gate
36 time slot counter
38 control register
40 comparator
42 clock input terminal
44 sync input terminal
46 failure input terminal
48 output terminal of the comparator
50 reset bit
52 first bus
54 second bus
60 failure pulse extension
62 AND gate
64 failure counter
66 third OR gate
68 flip-flop gate
70 integrated circuit

The invention claimed is:

1. A method for performing a test of a high-speed integrated circuit with at least one functional unit and a built-in self test capability by a low-speed test system, wherein the method comprises the steps of:
   a) transforming an external clock signal from the low-speed test system into a faster internal clock signal within the high-speed integrated circuit;
   b) generating a test pattern according to a predetermined scheme;
   c) applying the test pattern to the functional unit;
   d) comparing a response from the functional unit with an expected test pattern;
   e) if the response differs from the expected test pattern, then generating an internal failure signal;
   f) generating a predetermined number of time slots if several failures occur;

g) repeating the test several times if several failures occur, wherein every repetition corresponds with one selected time slot; and h) extending the internal failure signal to a length, which may be recognized by the test system.

2. The method according to claim 1, wherein the internal failure signal is extended to a length of a multiple of the internal clock cycle.

3. The method according to claim 1, wherein internal clock cycles are counted, if a failure occurs.

4. The method according to claim 3, wherein the internal clock cycles are counted from zero again, if a further failure occurs.

5. The method according to claim 1, wherein the test is repeated, if several failures occur.

6. The method according to claim 1, wherein the test is repeated with one selected time slot.

7. The method according to claim 1, wherein the external clock signal from the low-speed test system is transformed with a predetermined ratio into the internal clock signal.

8. A computer program product stored on a computer usable medium, comprising computer readable program means for causing a computer to perform a method for testing a high-speed integrated circuit having at least one functional unit and a built-in self-test capability by a low-speed test system, wherein the method comprises the steps of:

a) transforming an external clock signal from the low-speed test system into a faster internal clock signal within the high-speed integrated circuit;

b) generating a test pattern according to a predetermined scheme;

c) applying the test pattern to the functional unit;

d) comparing a response from the functional unit with an expected test pattern;

e) if the response differs from the expected test pattern, then generating an internal failure signal;

f) generating a predetermined number of time slots if several failures occur;

g) repeating the test several times if several failures occur, wherein every repetition corresponds with one selected time slot; and h) extending the internal failure signal to a length, which may be recognized by the test system.

9. The computer program product of claim 8, further comprising computer readable program means for causing the computer to perform the step of extending the internal failure signal to a length of a multiple of the internal clock cycle.

10. The computer program product of claim 8, further comprising computer readable program means for causing the computer to perform the step of counting internal clock cycles if a failure occurs.

11. The computer program product of claim 10, further comprising computer readable program means for causing the computer to perform the step of counting the internal clock cycles from zero if a further failure occurs.

12. An integrated circuit with at least one functional unit and built-in self-test features for testing the integrated circuit, wherein the built-in self-test features include the following components:

a clock multiplier for generating an internal clock from an external clock of a low-speed test system, a stimuli logic for generating a test pattern, a comparator for comparing a response from the functional unit with an expected test pattern, and a failure pulse extension for extending the failure signal to a length, which may be recognized by the lower-speed test system, wherein the failure pulse extension comprises a failure counter for counting the internal clock up to a predetermined number if a failure occurs; and a time slot generator, which is activated if several failures occur, wherein the time slot generator comprises a control register for selecting a time slot, wherein testing the integrated circuit is repeated several times, wherein every repetition corresponds with one selected time slot.

13. The integrated circuit according to claim 12, wherein the failure counter is restarted if a further failure occurs.

14. The integrated circuit according to claim 12, wherein the time slot generator includes a time slot counter.

* * * * *